(12) United States Patent
Wang et al.

(10) Patent No.: US 12,142,713 B2
(45) Date of Patent: Nov. 12, 2024

(54) LED DISPLAY SCREEN

(71) Applicant: APPOTRONICS CORPORATION LIMITED, Guangdong (CN)

(72) Inventors: Lin Wang, Guangdong (CN); Shijie Li, Guangdong (CN); Fei Hu, Guangdong (CN); Wei Sun, Guangdong (CN); Yi Li, Guangdong (CN)

(73) Assignee: Appotronics Corporation Limited, Guangdong (CN)

( * ) Notice: Subject to any disclaimer, the term of this patent is extended or adjusted under 35 U.S.C. 154(b) by 880 days.

(21) Appl. No.: 17/280,782

(22) PCT Filed: Sep. 26, 2019

(86) PCT No.: PCT/CN2019/107988
§ 371 (c)(1),
(2) Date: Aug. 10, 2021

(87) PCT Pub. No.: WO2020/063700
PCT Pub. Date: Apr. 2, 2020

(65) Prior Publication Data
US 2022/0005988 A1 Jan. 6, 2022

(30) Foreign Application Priority Data
Sep. 28, 2018 (CN) .............................. 201811137849

(51) Int. Cl.
*G02B 5/02* (2006.01)
*G02B 5/30* (2006.01)
(Continued)

(52) U.S. Cl.
CPC ............ *H01L 33/60* (2013.01); *G02B 5/0226* (2013.01); *G02B 5/0284* (2013.01); *G02B 5/3025* (2013.01); *H01L 25/0753* (2013.01)

(58) Field of Classification Search
CPC .... G02B 5/0226; G02B 5/021; G02B 5/3025; H01L 33/60; H01L 25/0753
See application file for complete search history.

(56) References Cited

U.S. PATENT DOCUMENTS 7,991,257 B1 * 8/2011 Coleman .............. G02B 6/0036
264/494
8,408,775 B1 * 4/2013 Coleman ........... G02F 1/133526
362/616

FOREIGN PATENT DOCUMENTS

CN 101515422 A 8/2009
CN 101582223 A 11/2009
(Continued)

OTHER PUBLICATIONS

First Office Action in CN Application No. 201811137849.8 dated Apr. 6, 2021 in 10 pages.
(Continued)

*Primary Examiner* — Walter H Swanson
*Assistant Examiner* — Jacob T Nelson
(74) *Attorney, Agent, or Firm* — Knobbe, Martens, Olson & Bear, LLP (57) ABSTRACT

An LED display screen, comprising: an LED array, consisting of multiple LED light-emitting units and used for emitting a light; an optical diffusion film, provided at a light exit side of the LED array; a matrix shading frame, comprising multiple hollow shading gratings, the hollow shading gratings corresponding one-to-one to the LED light-emitting units; and a substrate, used for supporting the LED array and the matrix shading frame, where the light emitted by the LED light-emitting units, after running through the hollow shading gratings, is diffused to a viewer side via the optical diffusion film, and the LED light-emitting units emit the light towards the hollow shading gratings.

16 Claims, 11 Drawing Sheets

(51) Int. Cl.
*G09F 9/33* (2006.01)
*H01L 25/075* (2006.01)
*H01L 33/58* (2010.01)
*H01L 33/60* (2010.01)

(56) References Cited

FOREIGN PATENT DOCUMENTS

| CN | 102042492 | A | | 5/2011 | |
| --- | --- | --- | --- | --- | --- |
| CN | 102338297 | A | | 2/2012 | |
| CN | 102402907 | A | | 4/2012 | |
| CN | 103090264 | A | * | 5/2013 | |
| CN | 103133949 | A | | 6/2013 | |
| CN | 103165039 | A | | 6/2013 | |
| CN | 203799042 | U | | 8/2014 | |
| CN | 104575307 | A | * | 4/2015 | G09F 9/33 |
| CN | 104730603 | A | | 6/2015 | |
| CN | 204596351 | U | | 8/2015 | |
| CN | 105933696 | A | | 9/2016 | |
| CN | 106051493 | A | | 10/2016 | |
| CN | 205920990 | U | | 2/2017 | |
| CN | 107209290 | A | | 9/2017 | |
| CN | 207217004 | U | | 4/2018 | |
| CN | 108257519 | A | | 7/2018 | |
| JP | 2001109007 | A | | 4/2001 | |
| JP | 2012-174371 | A | | 9/2012 | |
| JP | 2012-174372 | A | | 9/2012 | |
| JP | 2014031496 | A | | 2/2014 | |

OTHER PUBLICATIONS

First Search Report in CN Application No. 201811137849.8 dated Mar. 29, 2021 in 3 pages.
International Search Report issued in application No. PCT/CN2019/107988 on Jan. 6, 2020.
Notification to Grant Patent Right for Invention in CN 201811137849.8, dated Mar. 15, 2022.

* cited by examiner

Circular light distribution diffusion film

LED DISPLAY SCREEN

TECHNICAL FIELD

The present application relates to the field of display technology, and more particularly, to an LED display screen.

BACKGROUND

Conventional movie projection apparatus adopts a combination of a projector and a screen, in which image light is remotely projected by the projector onto the screen to enlarge an image, and the screen reflects the image light to a viewer side, thereby realizing large-screen display. Considering design defects of lenses in the projector and reflective characteristics of the screen, the conventional display apparatus with such projection have the disadvantages of poor picture uniformity, low brightness, poor image contrast and high energy consumption. In particular, the screen is a passive light-emitting device, which not only reflects the image light emitted by the projector, but also reflects environmental stray light from an auditorium, emergency indicators, etc. On the one hand, the screen is required to have a good reflectivity for the projected image light; and on the other hand, it is also required to avoid excessive reflection of ambient stray light. Therefore, projection brightness and contrast are hardly to be balanced simultaneously.

Further, 4K resolution film sources are displayed in more theater screenings with increasing demands of viewers on the visual effects of movies. In order to reduce costs and improve the contrast of the screen, some technical solutions have proposed an LED display screen that uses a pixelated LED array, in which one LED chip corresponds to one pixel for displaying. In this technical solution, since the LED display screen itself acts as a self-luminous light source without light loss that may occur during light propagation, it can provide very high brightness; and the brightness of the image can be changed by controlling an LED switch of a single pixel to obtain extremely high contrast.

However, Applicant has found in further research that, if the projection screen contains a darker image area and this area fails to exhibit sufficient "black", a theoretically high contrast has not actually been achieved. The reason is in that, pixels of the LED display screen reflect the ambient stray light, and thus the pixels that were originally turned off emit light.

In order to improve the contrast of the LED display screen and reduce influence of pixels on the ambient stray light, Applicant proposes the following solution: reducing a reflectivity of a non-light-emitting area outside an LED light-emitting unit.

Figure 1A:
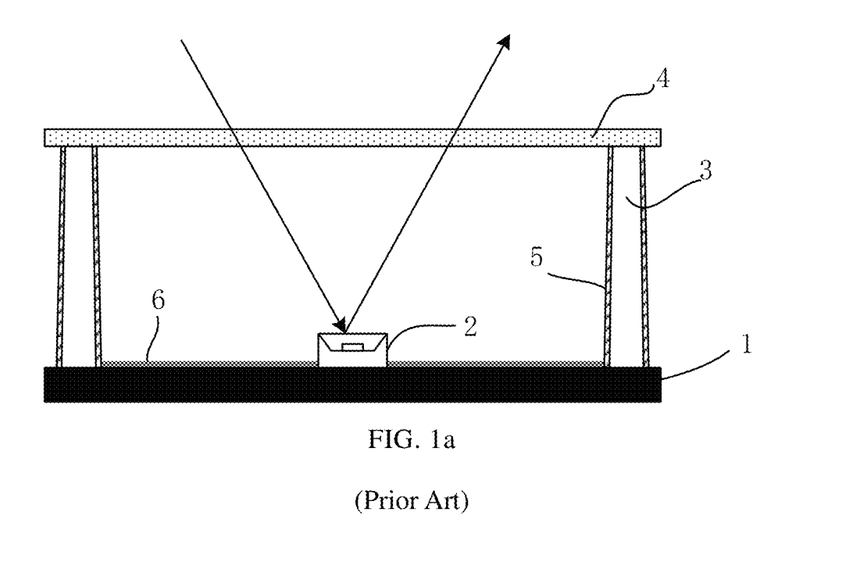
FIG. 1a is a schematic structural diagram of a pixel unit of a conventional LED display screen.
Figure 1B:
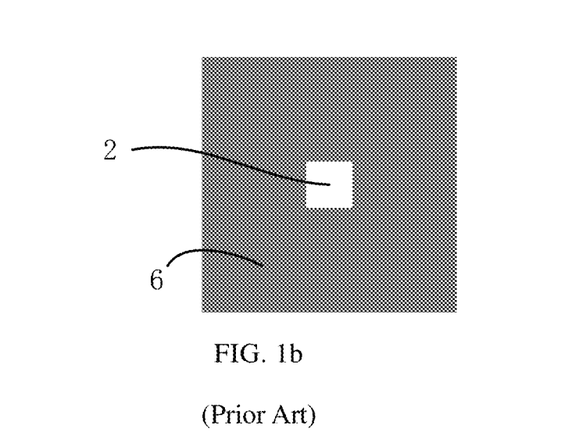
FIG. 1b illustrates a pixel black filling region when viewing pixels of the conventional LED display screen in FIG. 1a from a viewer side.

As shown in FIG. 1a, a pixel unit of the LED display screen includes a substrate 1, an LED light-emitting unit 2, a hollow light block grid 3, an optical diffusion film 4, a reflective coating 5 applied on a side wall of the hollow light block grid 3, and a light-absorbing material 6 coated on a surface of the substrate 1. The light-absorbing material 6 is coated on a region of the substrate 1 where the LED light-emitting unit 2 is not provided. In this LED display screen, the LED light-emitting unit 2 is arranged in a manner that a light-emitting surface thereof faces towards a viewer side, and the light-absorbing material 6 is configured to increase the contrast. FIG. 1b illustrates a pixel black filling region when viewing the pixels of the conventional LED display screen from the viewer side. It can be seen that a center region is a bright region, as the light-emitting surface of the LED light-emitting unit itself also reflects ambient stray light, so that improvement in contrast is not ideal.

In order to reduce the influence of the light-emitting surface of the LED light-emitting unit on the contrast, it is required to reduce a size of the LED light-emitting unit. However, reduction in the size of the LED light-emitting unit will bring a series of technical problems such as attaching and mounting process, yield, etc., and will also greatly increase the product cost, which is unconducive to the application and promotion of the product.

SUMMARY

In order to improve a contrast of an LED display screen, the present disclosure provides an LED display screen, which includes an LED array, a light block frame, and an optical diffusion film, and can significantly improve a pixel filing rate of LED light-emitting units without significantly increasing cost and power consumption. In this way, the LED display screen can display a softer picture thereon. In addition, the present disclosure can adopt a chip with a relatively larger size by using side-emitting LED light-emitting units, and the present disclosure can achieve a high contrast of the display screen by increasing the black filling rate.

In a first aspect of the present disclosure, an LED display screen is provided. The LED display screen includes: an LED array including a plurality of LED light-emitting units and configured to emit light; an optical diffusion film provided on a light-emitting side of the LED array; a matrix light block frame including a plurality of hollow light block grids, the plurality of hollow light block grids being arranged in one-to-one correspondence with the plurality of LED light-emitting units; and a substrate configured to support the LED array and the matrix light block frame. The light emitted by each of the plurality of LED light-emitting units is transmitted through one of the plurality of hollow light block grids corresponding to the LED light-emitting unit and then is diffused to a viewer side through the optical diffusion film, and the plurality of LED light-emitting units emits light towards the plurality of hollow light block grids.

The LED light-emitting units of the LED display screen of the present disclosure are arranged to emit light towards a side of the hollow light block grids. With such a structure, even if ambient light enters a pixel from outside of a screen surface, it cannot be directly incident to a light-emitting surface of the LEDs. The reason for this is in that a side of the LED light-emitting units facing towards the viewer side is covered, and the LED light-emitting units cannot directly reflect the ambient light, so that most of the ambient light is absorbed. Even if a small amount of the ambient light is reflected by the light block frame and reaches the light-emitting surface of the LED light-emitting units, it will decay after multiple reflections and then absorbed by various structures on a path of re-emission.

Therefore, when viewing the LED display screen from the viewer side, both the substrate and the LED light-emitting units are covered by a black light-absorbing material, and no reflective region is formed due to the reflection of ambient light, and a black filling rate of the pixel can be close to 100%.

Further, since the present disclosure adopts the above side-emitting structure, i.e., emitting light towards the side wall of the matrix light block frame, the black filling rate can be increased without reduction in the size of the LED light-emitting unit. Therefore, the LED light-emitting units of the present disclosure can be assembled using mature SMT mount technology, which has the beneficial effects of high production efficiency and low cost.

In addition, since all the light emitted by the side-emitting LED light-emitting units must be reflected by the side wall of the hollow light block grids one or more times, light beams will be distributed more consistently, avoiding the scenario in the technical solution of the forward-emitting LED light-emitting unit that direct outgoing emergent light and reflected emergent light both exist. In this way, the LED display screen can have significantly improved color uniformity.

In an embodiment, each of the plurality of LED light-emitting units further comprises a light guiding device configured to guide the light emitted by the LED light-emitting unit towards one of the plurality of hollow light block grids. This technical solution can transform the original front-emitting LED into an overall side-emitting LED light-emitting unit.

Preferably, a reflective layer is provided on a side wall of each of the plurality of hollow light block grids.

In an embodiment, the reflective layer is a diffusion layer. The diffusion layer can not only homogenize the light emitted by the LED light-emitting units through multiple reflections, but also can improve the uniformity of the light distribution using reflection properties of the diffusion layer, thereby achieving better light mixing effect.

In an embodiment, the reflective layer is a specular reflective layer. In this technical solution, for the ambient light being transmitted through the optical diffusion film, only ambient light of a specific angle can reach the light-emitting surface of the LED light-emitting units through the specular reflective layer, so that the LED display screen has a higher contrast against ambient light.

In an embodiment, the optical diffusion film has a diffusion angle greater than 10 degrees, so as to have a good shielding effect on gaps between the LED light-emitting units.

In an embodiment, the LED display screen further includes a polarizer disposed on an optical path of the light emitted by the LED array, and the polarizer includes first polarizing regions and second polarizing regions that are alternately arranged in an array. The light emitted by the LED array is transmitted through the first polarizing regions to generate first polarized light and is transmitted through the second polarizing regions to generate second polarized light.

BRIEF DESCRIPTION OF DRAWINGS

FIG. 8c is a side sectional view of a pixel unit of an LED display screen according to a variant embodiment of FIG. 8a.

DESCRIPTION OF EMBODIMENTS

Specific embodiments according to the present disclosure will be described in detail below with reference to drawings. It should be emphasized that all dimensions in the drawings are only schematic and are not necessarily shown in real scale, and thus they cannot be construed as limitations. For example, it should be understood that the size, ratio and other parameters of an LED array, an optical diffusion film, a light block frame and other components in the drawings are not illustrated in accordance with the actual size and ratio, only for the convenience of illustration, instead of limiting specific scope of the present disclosure.

Figure 11:
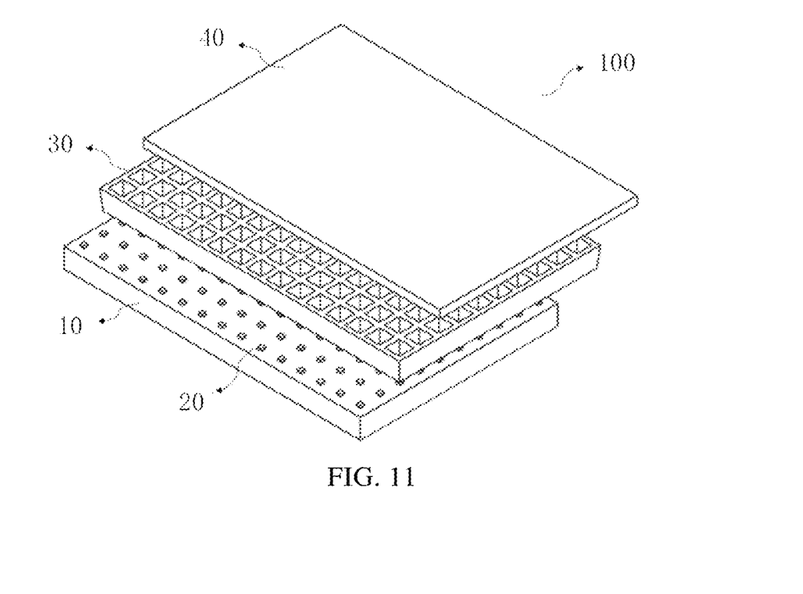
FIG. 11 is an exploded view showing an overall structure of an LED display screen of the present disclosure.

FIG. 11 is an exploded view showing an overall structure of an LED display screen of the present disclosure, and as shown in FIG. 11, the LED display screen 100 includes a substrate 10, an LED array 20, a matrix light block frame 30, and an optical diffusion film 40. The LED array 20 is composed of a plurality of LED light-emitting units, and the matrix light block frame includes a plurality of hollow light block grids arranged in one-to-one correspondence with the plurality of LED light-emitting units.

Figure 14:
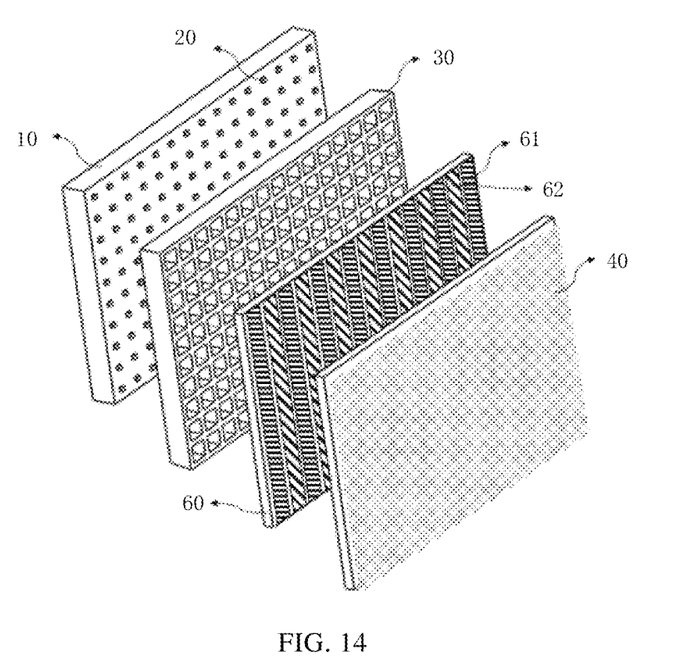
FIG. 14 is an exploded view of an overall structure of an LED display screen according to another embodiment of the present disclosure.

FIG. 14 is an exploded view of an overall structure of an LED display screen according to another embodiment of the present disclosure. The LED display screen includes a substrate 10, an LED array 20, a matrix light block frame 30, an optical diffusion film 40, and a polarizer 60. The present embodiment differs from the embodiment shown in FIG. 11 in that, the polarizer 60 is additionally disposed on an optical path through which light emitted by the LED array is transmitted. The polarizer 60 includes first polarizing regions 61 and second polarizing regions 62 that are arranged alternately in an array. The light emitted by the LED array is transmitted through the first polarizing regions 61 to generate first polarized light, and is transmitted through the second polarizing regions 62 to generate second polarized light.

In the present embodiment, the polarize 60 is disposed between the matrix light block frame 30 and the optical diffusion film 40. In other embodiments, the polarizer may be disposed on a side of the optical diffusion film facing away from the LED array. It is also possible to dispose the polarizer on a surface of a transparent substrate close to the LED array, in order to protect the polarizer from abrasion.

In the present embodiment, the first polarizing regions and the second polarizing regions are alternately arranged in strips. In other embodiments, the first polarizing regions and the second polarizing regions may be alternately arranged in a horizontal direction and a longitudinal direction, respectively, similar as black and white grids of chess.

In this embodiment, by adding the polarizer 60, the light emitted by the LED array can form images in two polarization states for 3D display.

Figure 2:
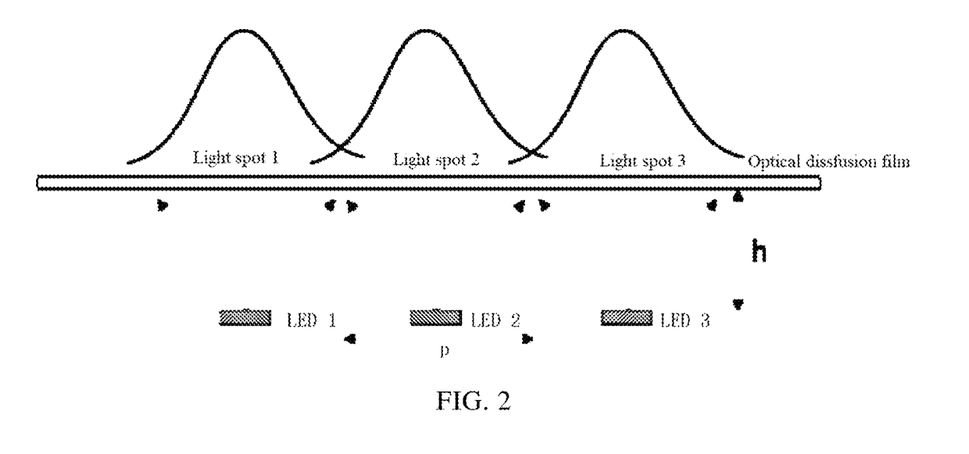
FIG. 2 is a schematic sectional view of a structure of an LED display screen.

FIG. 2 is a schematic sectional view of a structure of an LED display screen. A top-bottom direction of FIG. 2 is a direction perpendicular to the LED display screen, and an upper side of the LED display screen is a viewer side. FIG. 2 also shows positions and intensity of light spots formed by LED light-emitting units of the LED display screen.

FIG. 2 only shows an LED array and an optical diffusion film included in the LED display screen, where p is a spacing between adjacent LED light-emitting units in the LED array or a pixel size of the LED display screen, and h is a distance between the optical diffusion film and the LED array in a direction perpendicular to a surface of the optical diffusion film. The optical diffusion film is placed at a position closer to the viewer side than the LED array at a certain distance, that is, on a light exiting side of the LED array. In this way, the light emitted by the LED array is transmitted through the hollow light block grid corresponding to each LED light-emitting unit, and then is scattered to the viewer side through the optical diffusion film.

An object can be seen by human eyes when the object is imaged on the retina of the eyes. When no optical diffusion film is provided in the LED display screen, the LED light-emitting unit array of the LED display screen is directly imaged to the human eyes. Therefore, even if the light of the LED light-emitting units overlap each other, it will not affect the fact that the picture imaged to the human eyes is composed of LED light-emitting unit arrays separated from each other. When an optical diffusion film is provided in the LED display screen, the optical diffusion film changes light distribution of the light emitted by the LED light-emitting units, allowing the optical diffusion film to be a "passive light source". In this case, the human eyes images the optical diffusion film with image information onto the retina, instead of imaging the separated LED arrays. Therefore, as long as a pixel filling rate of each image corresponding to the optical diffusion film is sufficiently high, granular sensation of the image display can be eliminated.

The pixel filling rate of the LED light-emitting unit is defined as a ratio of a light-emitting surface area of the LED light-emitting unit to a pixel area. When the optical diffusion film is provided, the optical diffusion film becomes a new light source for imaging to the human eyes, and a new pixel filling rate should be defined as a ratio of a spot area on the optical diffusion film corresponding to a single pixel to the pixel area. The spot area can be determined by the following method: acquiring a spot corresponding to a single pixel, wherein a central illuminance value is L, a spot area is an area where the illuminance value of this spot is not less than aL, where $0<\alpha<0.5$.

As an example, FIG. 2 illustrates that the LED array includes three LED light-emitting units, i.e., LED1, LED2 and LED3. Those skilled in the art can understand that the LED array may include any number of LED light-emitting units as needed. The chips LED1, LED2, and LED3 form a light spot 1, a light spot 2, and a light spot 3, respectively. In FIG. 2, curves above the light spots are illuminance distribution curves of the light spots along a screen direction, which may also be equivalent to brightness distribution curves. A value on the curve corresponding to each position on the optical diffusion film is a spot illuminance value. It can be seen that the illuminance of the light spot close to the center of the LED light-emitting unit is relatively great, and the illuminance close to the edge of the LED light-emitting unit is relatively small.

A pixel filling rate on an incident side of the optical diffusion film is increased, in order to ensure a sufficiently great pixel filling rate on an output side of the optical diffusion film. When a distance h between the optical diffusion film and the LED light-emitting units is the smallest (that is, the optical diffusion film is closely attached to a light-emitting surface of the LED light-emitting units), the illuminance distribution curve of a single light spot is very sharp. In this case, the illuminance distribution is concentrated on a position of the light-emitting surface of the LED light-emitting unit, and the illuminances of other regions are close to 0, such that the pixel filling rate of the optical diffusion film is approximately equal to the pixel filling rate of the LED light-emitting unit array itself. As the distance h between the optical diffusion film and the light-emitting surface of the LED light-emitting units gradually increases, the light spot of the LED light-emitting unit gradually enlarges on a surface of the optical diffusion film, and a half-peak width of the illuminance distribution curve gradually increases until illuminance distribution curves of two adjacent LED light-emitting units overlap each other.

With the above structure, the LED display screen of the present disclosure can effectively shield gaps between the LED light-emitting units through the optical diffusion film, thereby improving the pixel filling rate of the LED display screen, and the pixel filling rate may be greater than 70%.

The optical diffusion film used in the present disclosure generally adopts transparent PC or PET as a base material, including a bulk diffusion film or a surface diffusion film.

The bulk diffusion film is provided with bulk diffusion particles. The bulk diffusion film with the diffusion particles can be obtained by using a precision optical coating equipment. For example, the bulk diffusion particles are inorganic particles such as silicon dioxide particles and titanium dioxide particles, or organic particles such as acrylic resin and epoxy resin particles.

The surface diffusion film has a rough structure on the surface thereof, which can be formed by a roll-to-roll embossing process.

Diffusion angle is an important optical performance parameter of the optical diffusion film. The definition of the diffusion angle of the optical diffusion film is explained below with reference to FIG. 3 to FIG. 4.

Figure 3:
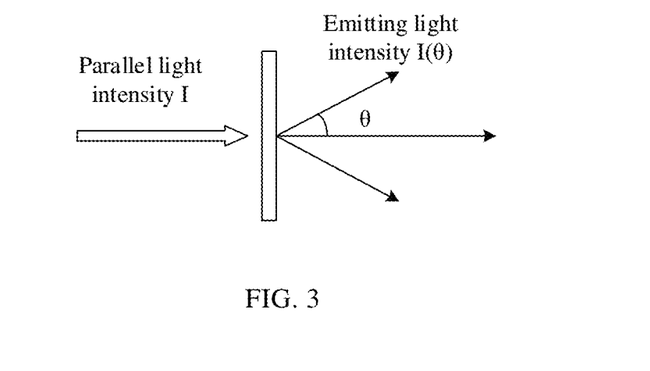
FIG. 3 is a schematic diagram illustrating changes before and after light is transmitted through an optical diffusion film.
Figure 4:
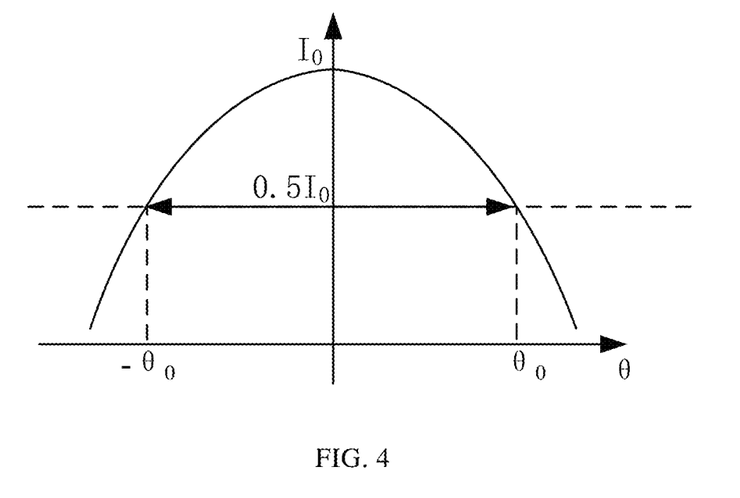
FIG. 4 illustrates a relationship between intensity $I_0$ and an angle θ of parallel light emitted by LED light-emitting units.

FIG. 3 is a schematic diagram illustrating changes before and after light is transmitted through the optical diffusion film. When a beam of parallel light is incident to the optical diffusion film, an angular distribution of the light is changed, and the emitting light forms a beam with a certain divergence angle, in a form of light cone. For the optical diffusion films with different optical properties, shapes of the light cone are different.

According to FIG. 3, the incident parallel light incident on the optical diffusion film has an intensity I, and the emitting light of the optical diffusion film is light of which intensity changes with angle, defined as $I(\theta)$, where $\theta$ is an angle enclosed between the light beam and a normal line of the optical diffusion film. If $\theta$ is 0, $I(0)=I_0$, i.e., a central intensity of the emitting light; a value of angle $\theta_0$ corresponding to an intensity $0.5I_0$ of the emitting light is calculated, i.e., $0.5I_0=I(\theta_0)$. Then, a value of $2\theta_0$ is defined as the diffusion angle of the optical diffusion film. That is, the diffusion angle of the optical diffusion film is a light cone angle of the light cone of the emitting light that is not smaller than half of the intensity of the central light beam.

In the present disclosure, the diffusion angle of the optical diffusion film should be greater than 10 degrees, and more preferably greater than 40 degrees. The larger the diffusion angle is, the better blocking effect of the optical diffusion film has on the gaps between the LED light-emitting units. Moreover, the larger the diffusion angle is, the larger a view angle of the LED display screen has.

Figure 5A:
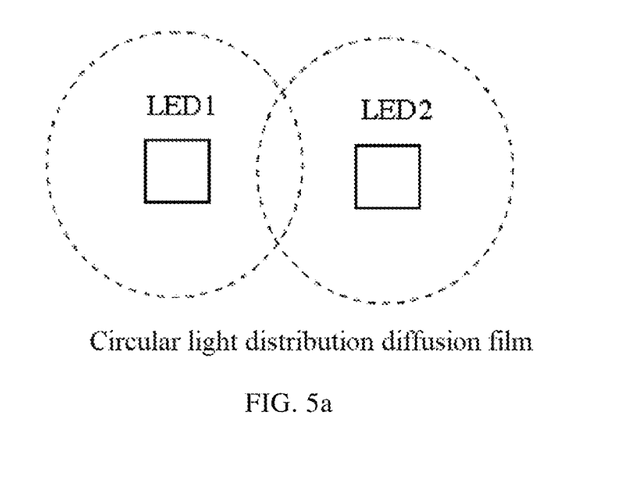
FIG. 5a illustrates a circular light distribution when the optical diffusion film is an isotropic diffusion film.

The optical diffusion film may be an isotropic diffusion film. As shown in FIG. 5a, when an isotropic diffusion film is used, it can be seen from the viewer side that the diffusion angles of the diffusion film in all directions are the same.

Figure 5B:
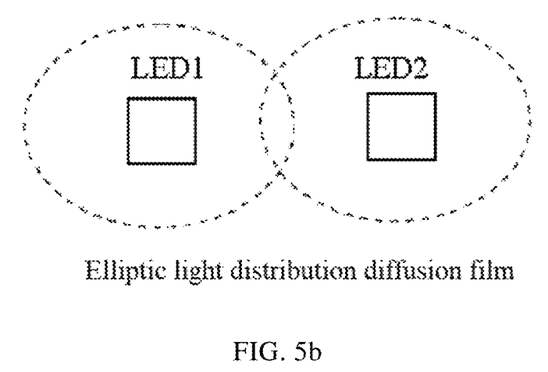
FIG. 5b illustrates an elliptical light distribution when the optical diffusion film is an anisotropic diffusion film.

The optical diffusion film may be an anisotropic diffusion film. For example, when the anisotropic diffusion film as shown in FIG. 5b is adopted, it can be seen from the viewer side that the diffusion angle of the diffusion film in a horizontal direction is greater than that in a vertical direction, so that the horizontal field of view is increased. It can be understood that dotted circles/ellipses in FIG. 5a and FIG. 5b indicate light diffusion characteristics of the optical diffusion film, which represent a shape of the light cone (circular cone or elliptic cone) formed after the parallel light is incident to the optical diffusion film, rather than a shape of the actual light spot on the diffusion film.

Certainly, the anisotropic diffusion film may allow a diffusion angle in the vertical direction to be greater than the diffusion angle in the horizontal direction, or may allow a diffusion angle in any direction greater than a diffusion angle in other direction.

Intensity distribution of the LED light-emitting units is Lambertian distribution, in which there are much large-angle light, and crosstalk between adjacent pixels is likely to occur, thereby reducing the definition of the image.

The LED display screen of the present disclosure further includes a plurality of hollow light block grids, in order to solve the problem of crosstalk. The plurality of hollow light block grids forms a matrix-shaped light block frame, also referred to as a matrix light block frame, and are arranged in one-to-one correspondence with the LED light-emitting units constituting the LED array. The hollow light block grid is arranged between the LED light-emitting units, and is configured to surround each LED light-emitting unit. In each LED light-emitting unit encapsulation, three-color chips RGB are arranged linearly.

The overall basic structure of the LED display screen of the present disclosure is described above, and the structure of the pixel unit of the LED display screen of the present disclosure is described in detail below. In order to improve the contrast of the LED display screen, the LED light-emitting unit of the LED display screen of the present disclosure differs from the LED light-emitting unit with a front-emitting structure illustrated in FIG. 1 in that the light-emitting unit of the present disclosure is a side-emitting LED light-emitting unit.

FIG. 6a to FIG. 9b are schematic structural diagrams of pixel units of LED display screens according various embodiments of the present disclosure. For convenience of description, the same components are denoted with identical reference signs. A pixel unit of the LED display screen includes a substrate 1, an LED light-emitting unit 2, a hollow light block grid 3, and an optical diffusion film 4. In addition, the pixel unit further includes a reflective layer 5 coated on a side wall of the hollow light block grid 3 and a light-absorbing material 6 coated on a surface of the substrate 1. The substrate 1 constitutes a part of the substrate 10 shown in FIG. 11. A plurality of LED light-emitting units 2 constitutes an LED array 20. A plurality of hollow light block grids 3 constitutes a matrix light block frame 30. The optical diffusion film 4 constitutes a part of the optical diffusion film 40. Further, the optical diffusion films 4 of the plurality of pixel units constitute an optical diffusion sub-film, and then a plurality of optical diffusion sub-films is spliced to obtain the entire optical diffusion film 40.

Figure 6A:
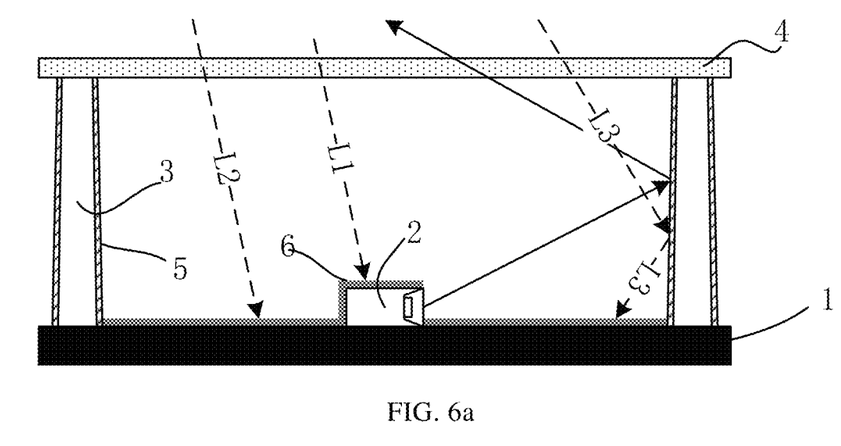
FIG. 6a is a side sectional view of a pixel unit of an LED display screen according to an embodiment of the present disclosure.

Referring to FIG. 6a, this embodiment differs from the technical solution shown in FIG. 1a in that the LED light-emitting unit 2 emits light towards the hollow light block grid 3, and a surface of the LED light-emitting unit 2 facing towards the viewer side is covered by the light-absorbing material 6.

Figure 6B:
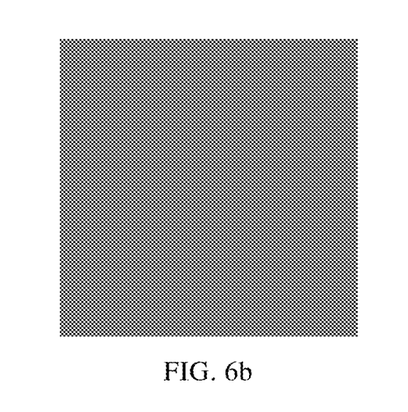
FIG. 6b is a schematic diagram of the pixel unit of the LED display screen shown in FIG. 6a when viewing from a viewer side.

FIG. 6b is a schematic diagram of the pixel unit of the LED display shown in FIG. 6a when viewing from the viewer side. Referring to FIG. 6b, this embodiment differs from that shown in FIG. 1b in that the brighter region in the center disappears.

In this embodiment, the reflective layer 5 is provided on the side wall of the hollow light block grid 3. When the LED light-emitting unit 2 emits light towards the hollow light block grid 3, the light beam is reflected by the reflective layer 5 and exits through the optical diffusion film 4. Solid arrows shown in FIG. 6a represent a light beam, and the light beam exits after being reflected once by the reflective layer 5. It can be understood that some other light beams, especially light beams incident on the reflective layer 5 at a small angle, can be reflected multiple times before exiting. In this embodiment, all the light beams emitted by the LED light-emitting-unit 2 are reflected and then exit, which facilitate to improve uniformity of the distribution of the light beams. A four-sided reflecting wall surrounded by the reflective layer 5 of the hollow light block grid 3 is equivalent to an optical integrator rod to homogenize the light of the LED light-emitting unit.

In this embodiment, a covering area of the light-absorbing material 6 is greatly increased. The light-absorbing material 6 not only covers a portion of the substrate 1 where no LED light-emitting unit 2 is provided, but also covers the surface of the LED light-emitting unit 2 facing towards the viewer side. Thus, there is no ambient light incident to the pixel unit and directly reflected by the LED light-emitting unit 2, thereby further increasing the contrast. In the above structure of the present disclosure, a high pixel black filling rate can be achieved even though the size of the LED light-emitting unit is not reduced. The light-absorbing material 6 may contain black organic pigment such as azo, etc., or inorganic pigment such as carbon black, metal oxide, etc.

FIG. 6*a* also illustrates three ambient light beams incident to the pixel unit, which are indicated by dotted arrows. L1 is directly incident to the LED light-emitting unit 2 after being transmitted through the optical diffusion film 4. In this embodiment, as the surface of the LED light-emitting unit 2 facing towards the viewer side is covered by the light-absorbing material 6, this part of the ambient light is directly absorbed by the light-absorbing material 6 and thus will not exit, thereby reducing the contrast of the LED display. Another ambient light beam L2 is incident on the substrate 1 at the position where no LED light-emitting unit 2 is provided and is also covered by the light-absorbing material 6, such that the ambient light L2 is directly absorbed.

In addition, another ambient light beam L3 is incident on the reflective layer 5 of the hollow light block grid 3 after being transmitted through the optical diffusion film 4 and then is reflected. In this embodiment, the reflective layer 5 is a specular reflective layer, and the ambient light beam L3 is directly absorbed by the light-absorbing material 6 provided on the substrate 1 after being reflected by the specular reflective layer, and will not exit again. For the specular reflective layer, the certain incident light beam corresponds to a unique reflected light beam, and thus only the light beam incident on the reflective layer 5 at a specific angle can be reflected into the light-emitting surface of the LED light-emitting unit 2. Even if the ambient light at the specific angle reaches the light-emitting surface of the LED light-emitting unit 2, the light beam reflected by the light-emitting surface may still be reflected on and absorbed by the light-absorbing material 6. Accordingly, the reflective layer 5 with the specular reflection structure can eliminate influence of the ambient light on the contrast to the greatest extent by utilizing the limitation of reflection angle.

The specular reflective layer may be a metal reflective coating such as a silver reflective layer, an aluminum reflective layer, etc., or it may be a composite layer of stacked mediums with different refractive indexes.

In this embodiment, the LED light-emitting unit 2 adopts mature SMT mount technology to assemble the LED chip on the substrate 1.

Figure 6C:
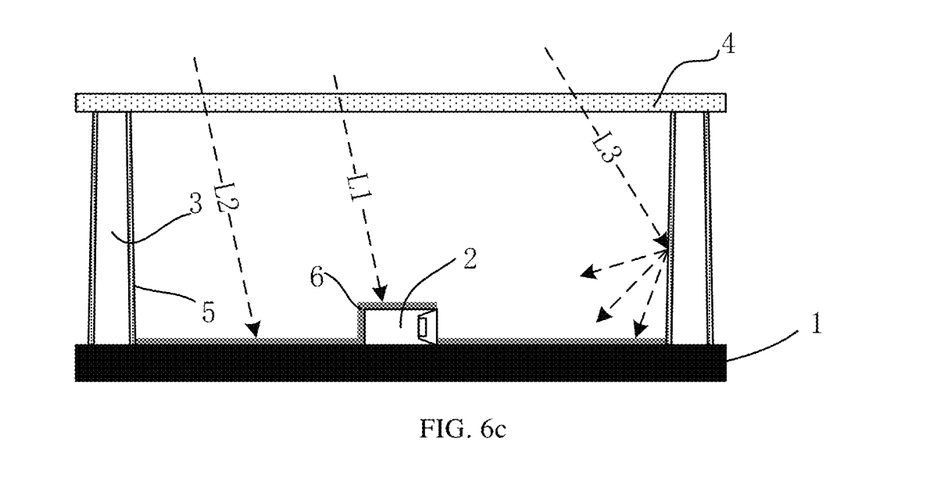
FIG. 6c is a side sectional view of a pixel unit of an LED display screen according to another embodiment of the present disclosure.

In the present disclosure, the reflective layer 5 is not limited to the structure of the specular reflective layer. FIG. 6*c* is a side sectional view of a pixel unit of an LED display screen according to another embodiment of the present disclosure. This embodiment differs from the embodiment shown in FIG. 6*a* in that the reflective layer 5 is a diffusion layer.

The diffusion layer has a different reflective effect on incident light from that of the specular reflective layer, and the reflected light is in a shape of light cone, that is, the reflected light is diffused at a certain angle. A reflective layer can be divided into Lambertian reflective layer, Gaussian reflective layer, etc., based on angular distribution of the reflected light. The reflected light incident to the Lambertian reflective layer exhibits Lambertian distribution (uniform angular distribution of 180°), and the reflected light incident to the Gaussian reflective layer exhibits Gaussian distribution, in which the beam is mostly concentrated in a position of a center beam, and the center beam is a beam reflected by specular reflection.

As shown in the figure, the ambient light incident on the reflective layer 5 is reflected to form a light cone, most of which is reflected to and absorbed by the light-absorbing material 6, and only a very small part of the light cone is incident to the light-emitting surface of the LED light-emitting unit 2 and then is partially reflected to and absorbed by the light-absorbing material 6 during the exiting process.

In this embodiment, the reflective layer 5 of the diffusion layer can reflect most of the ambient light to the light-absorbing material 6 and also can homogenize the angular distribution of the light emitted from the LED light-emitting unit 2, which increases a number of reflections of a part of the light, thereby achieving the effect of light homogenization.

The description of other devices in the embodiment shown in FIG. 6*c* can refer to the corresponding description of the embodiment shown in FIG. 6*a*.

In general, the emitted light of the LED chip cannot guarantee chromaticity uniformity thereof, which is specifically expressed as: the light emitted from the LED chip is measured from different angles with respect to the LED chip, and the obtained color coordinates are different. For example, a traditional white light LED chip encapsulated with a blue light chip and a YAG phosphor powder has emitted large-angle light that is yellowish relative to the central beam. In the LED display screen, the LED chip has the same problem. However, through the reflection effect of the matrix light block frame, the matrix light block frame functions as a light homogenizing rod, which homogenizes the emitted light of the LED chip, thereby weakening change in color deviation of the LED chip with the angle.

In the present disclosure, all the light emitted by the LED light-emitting unit is reflected by the reflective layer of the hollow light block grid and exits, thereby further improving consistency of the color coordinates of the emitted light. This is proved through simulation experiments as below.

In general, CIE1976 color coordinates are used to measure uniformity of colors and angles of pixels. A distance (i.e., color deviation) Du'v' between a color coordinate (u1', v1') of the light emitted at a large angle and a color coordinate (u0', v0') of the central beam is calculated by the following formula:

$$Du'v'=\sqrt{(u'_1-u'_0)^2+(v'_1-v'_0)^2}.$$

Figure 12:
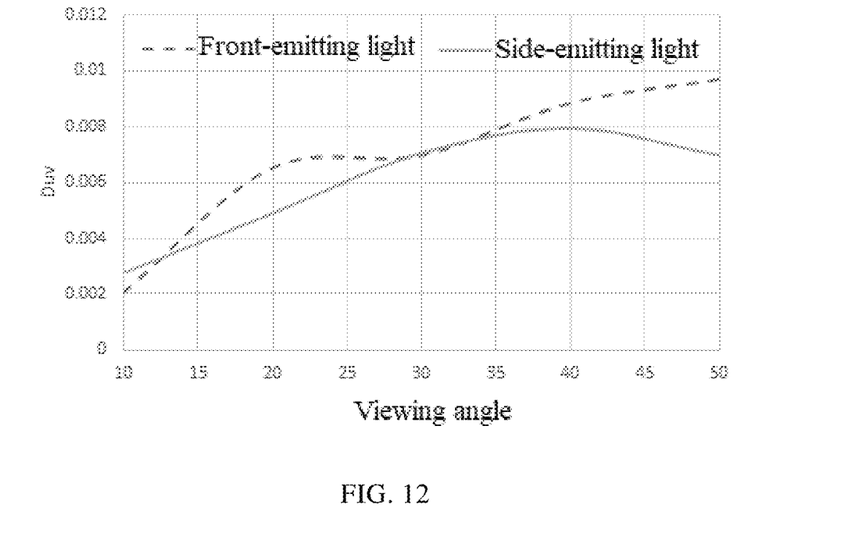
FIG. 12 is a graph illustrating a comparison of light mixing effects between an LED display screen of the present disclosure and a conventional LED display screen.

In FIG. 12, a horizontal axis represents a viewing angle deviating from the normal line of the LED display screen (the normal line corresponds to 0 degree), and a vertical axis represents the color deviation Du'v'. A greater value of Du'v' indicates a greater color difference between the light emitted at the measurement angle and the light emitted at 0 degree.

By measuring values of the color difference at different measurement angles, it can be seen from simulation results shown in FIG. 12 that, at the same height of the light block frame, compared with the front-emitting LED light-emitting unit (corresponding to a dotted line in FIG. 12), the side-emitting LED of the present disclosure (corresponding to a solid line in FIG. 12) has better color mixing effect, particularly at a larger viewing angle. In this way, the LED display screen of the technical solution of the present disclosure has superior viewing angle parameters.

Figure 13:
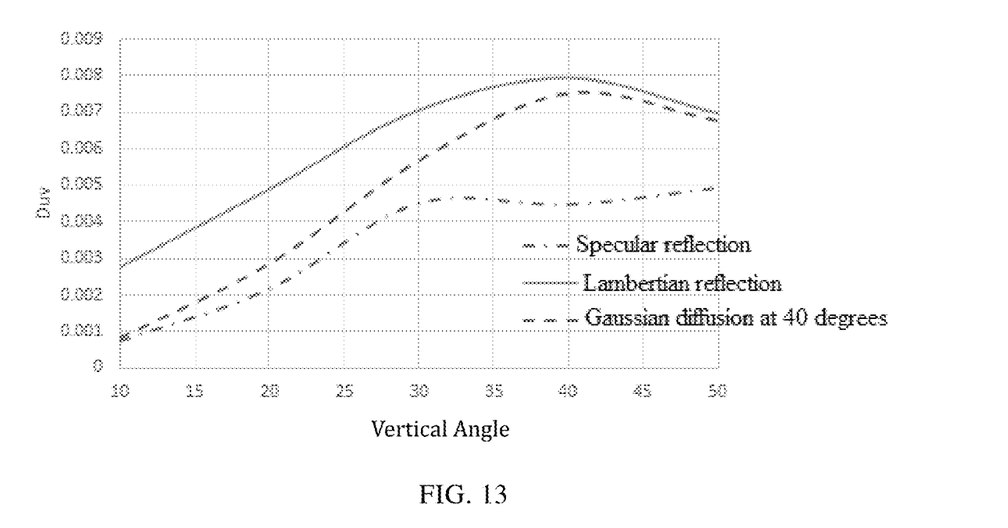
FIG. 13 is a graph illustrating a comparison of light mixing effects of different reflective layers of a light block grid of an LED display screen of the present disclosure.

In order to test the effect of different types of the reflectively layer of the hollow light block grid on the color deviation of the LED display screen, a specular reflection layer, a Lambertian reflection layer, and a Gaussian reflection layer are selected for simulation experiments. In FIG. 13, a vertical angle denoted on a horizontal axis is an angle between the light from a viewer or a measuring instrument to the pixel and the normal line of the LED display screen, and a vertical axis denotes the color deviation Du'v'. The smaller the color deviation Du'v' is and the smoother the curve is, the better the light mixing effect is. It can be obtained from the simulation results shown in FIG. 13 that, the specular reflection layer has better light mixing effect at the same height of the light block frame. This is because the technical solution of the specular reflection layer has better effect against ambient light and can reduce the influence of ambient stray light on the detected results.

Figure 7:
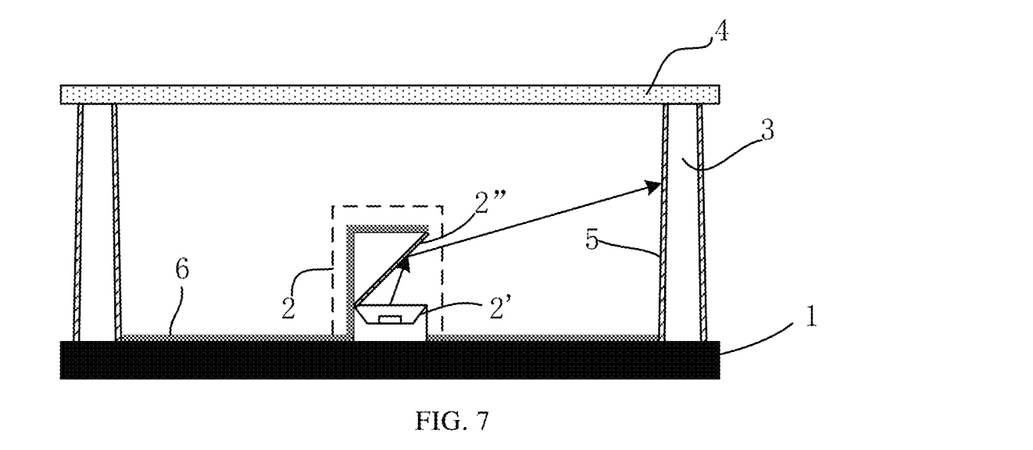
FIG. 7 is a side sectional view of a pixel unit of an LED display screen according to yet another embodiment of the present disclosure.

In the embodiments shown in FIG. 6a and FIG. 6c, the LED chips of the LED light-emitting units are both mounted on the substrate 1 in a side-emitting manner. In the present disclosure, the LED chip may also be mounted on the substrate 1 in a front-emitting manner by adding an additional optical structure. As shown in FIG. 7, an LED chip 2' of the LED light-emitting unit 2 (a portion indicated with a dotted frame in the figure) is mounted on the substrate 1 in a front-emitting manner. In addition, the LED light-emitting unit 2 further includes a light guiding device 2" configured to reflect light emitted from the LED chip 2' and finally guide the emitted light of the LED light-emitting unit 2 towards the hollow light block grid 3 to exit therefrom.

In this embodiment, the light guiding device 2" includes a mirror. It can be understood that, in other modified embodiments, the light guiding device may also be replaced with other optical devices such as a light guide, as long as the light emitted by the LED light-emitting unit can be guided towards the hollow light block grid and then exit therefrom.

In each of the above embodiments, the LED light-emitting unit 2 is provided at the center of the pixel unit. It can be understood that, in a case of the front-emitting LED light-emitting unit (i.e., emitting light towards the viewer side), the uniformity of the emitted light can be improved by arranging the LED light-emitting unit at the center of the pixel unit. However, in the present disclosure, the LED light-emitting unit 2 does not directly emit light towards the viewer side, and the light emitted from the pixel unit of the LED display screen actually is the light reflected by the reflective layer of the hollow light block grid multiple times. Therefore, the LED light-emitting unit 2 is not required to be provided at the center of the pixel unit.

Figure 8A:
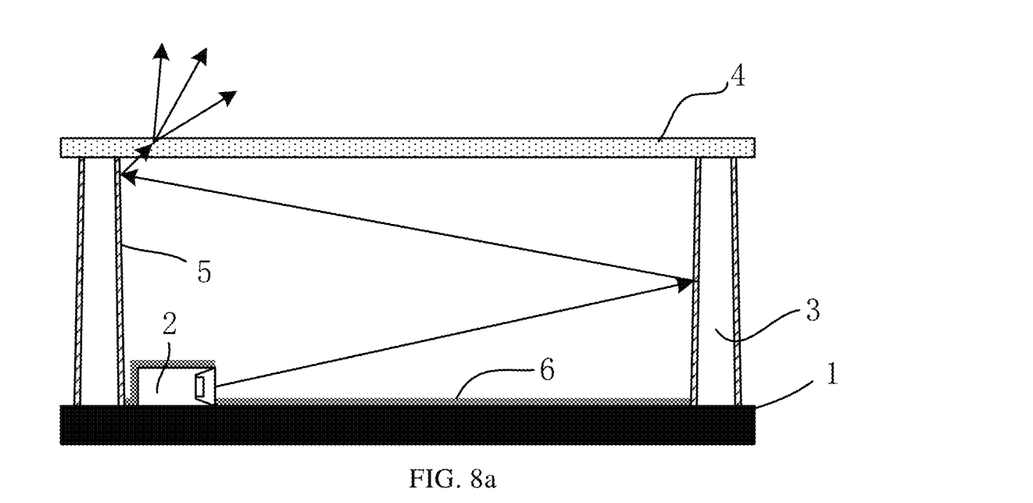
FIG. 8a is a side sectional view of a pixel unit of an LED display screen according to another embodiment of the present disclosure.
Figure 8B:
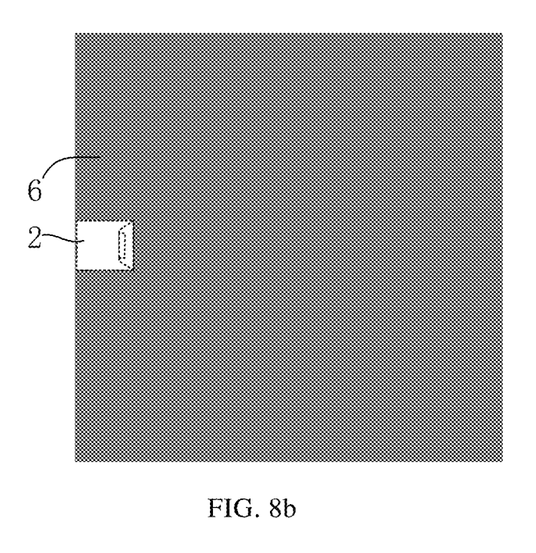
FIG. 8b is a schematic diagram of the pixel unit of the LED display screen shown in FIG. 8a when viewing from a viewer side.

FIG. 8a and FIG. 8b are side sectional views of a pixel unit of an LED display screen according to another embodiment of the present disclosure. This embodiment differs from the embodiment shown in FIG. 6a is in that the LED light emitting unit 2 is arranged at an edge position of the pixel unit, that is, arranged at a position deviating from the center of the corresponding hollow light block grid. As shown in FIG. 8b, the dotted line indicates that the light-emitting unit 2 is covered by and arranged under the light-absorbing material 6, and the light-emitting unit 2 is located at a middle position of one side of the pixel unit. It can be understood that the light-emitting unit 2 may also be located at other position such as a corner.

In this embodiment, the position of the LED light-emitting unit in the pixel unit is not limited, which greatly improves the yield in the actual manufacture of the product.

Figure 8C:
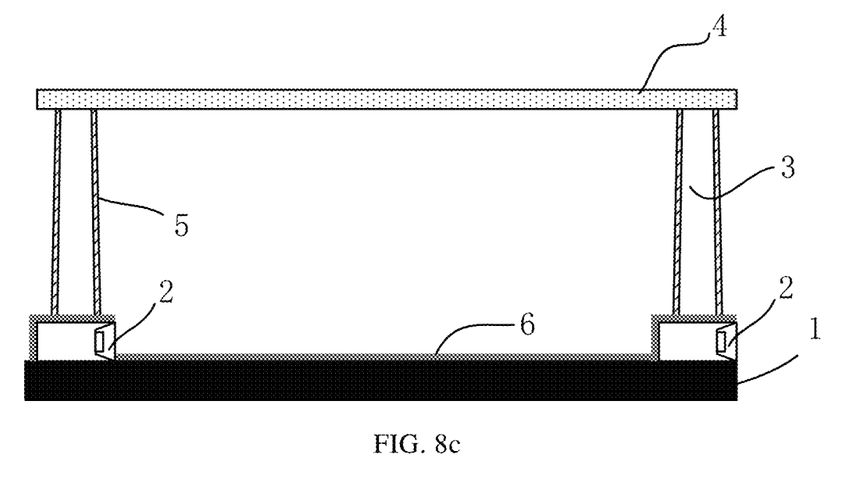

FIG. 8c is a side sectional view of a pixel unit of an LED display screen according to a modification of the embodiment of FIG. 8a. Referring to FIG. 8c, this embodiment different from the embodiment shown in FIG. 8a in that the light-emitting unit 2 is arranged under the corresponding hollow light block grid 3. On the one hand, this technical solution can reduce the height of the matrix light block frame when the distance between the optical diffusion film and the substrate is constant, thereby reducing material consumption and overall weight. On the other hand, the back side of the light-emitting unit 2, i.e., a side facing away from the light emitting direction, is hidden at the position of the hollow light block grid 3, which reduces the non-uniformity problem caused by the back side of the light emitting unit 2 without light emission (of course, this non-uniformity problem can be solved by increasing the height of the matrix light block frame), thereby allowing the light to illuminate the entire internal space of the pixel unit.

Figure 9A:
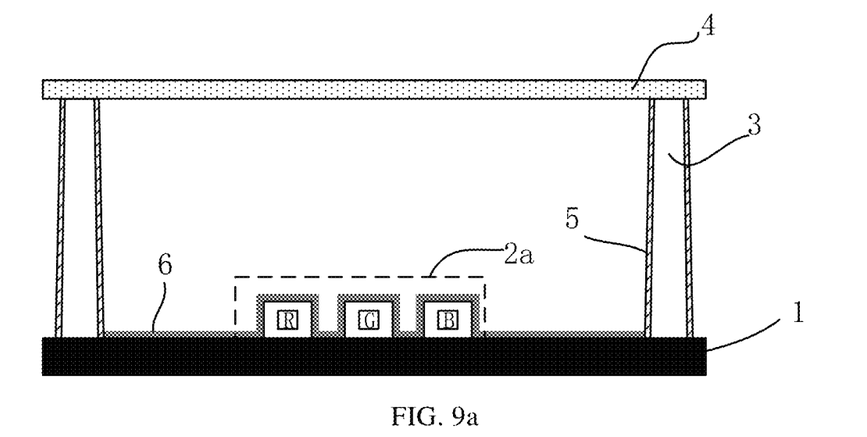
FIG. 9a is a side sectional view of a pixel unit of an LED display screen according to another embodiment of the present disclosure.
Figure 9B:
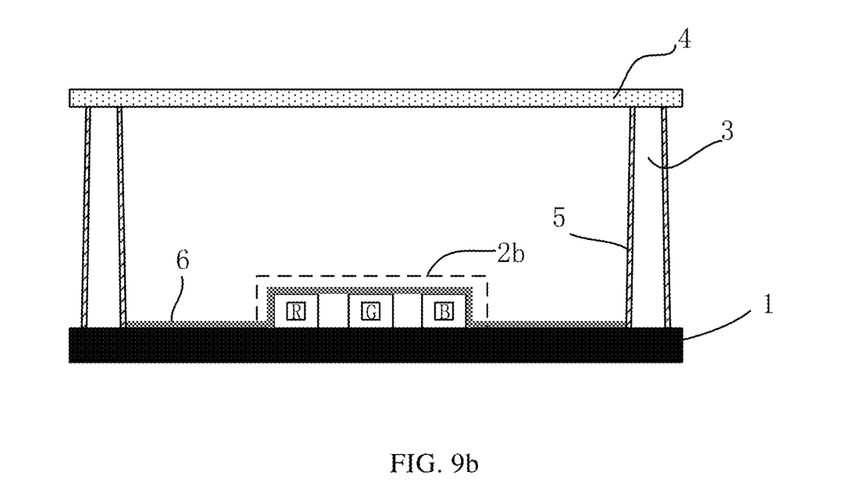
FIG. 9b is a side sectional view of a pixel unit of an LED display screen according to another embodiment of the present disclosure.

In each of the above embodiments, the LED light-emitting unit shown in the drawing includes one LED chip, but it can be understood that the one LED chip can also be replaced with a plurality of LED chips, or a multi-chip integrated LED package. FIG. 9a and FIG. 9b are side sectional views of a pixel unit of an LED display screen according to other embodiments of the present disclosure. These two embodiments differ from the above embodiments only in that the LED light-emitting unit includes three-color RGB chips. The LED light-emitting unit is illustrated in a dotted frame in the drawing. In the embodiment of FIG. 9a, the three-color RGB chips of the LED light-emitting unit 2a are separately provided, and the surface of each LED chip facing towards the viewer side is coated with the light-absorbing material 6. In the embodiment of FIG. 9b, the three-color RGB chips of the LED light-emitting unit 2b are encapsulated in one structure, and the entire surface facing towards the viewer side is coated with the light-absorbing material 6. In FIG. 9a and FIG. 9b, the LED light-emitting unit emits light inwardly or outwardly from the paper surface, and light is not shown.

It can be understood that, although the LED light-emitting unit includes three RGB LED chips in the embodiments shown in FIGS. 9a and 9b, a combination of any number and any color of LED chips is also possible in other embodiments of the present disclosure.

Figure 10A:
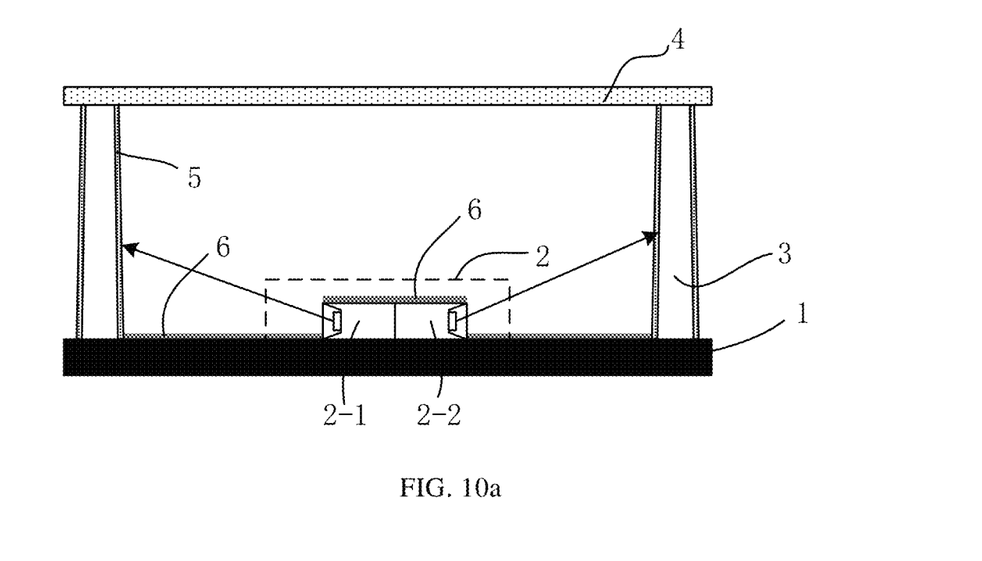
FIG. 10a is a side sectional view of a pixel unit of an LED display screen according to another embodiment of the present disclosure.
Figure 10B:
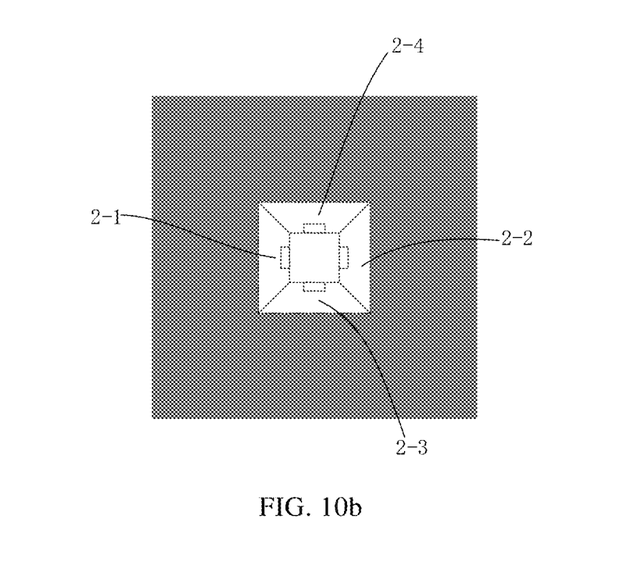
FIG. 10b is a schematic diagram of the pixel unit of the LED display screen shown in FIG. 10a when viewing from a viewer side.

FIG. 10a and FIG. 10b are side sectional views of a pixel unit of an LED display screen according to yet another embodiment of the present disclosure. This embodiment differs from the above embodiments only in that the LED light-emitting unit 2 includes a plurality of LED chips, and different LED chips emit light towards different sides of the hollow light block grid corresponding to the LED light-emitting unit 2.

With reference to FIG. 10b, the light-emitting unit 2 includes four LED chips, i.e., LED chips 2-1, 2-2, 2-3, and 2-4, which are indicated by dotted lines and covered by and arranged under the light-absorbing material 6. Only two LED chips 2-1 and 2-2 are illustrated in the sectional view of FIG. 10a. In this embodiment, the four LED chips of the light-emitting unit 2 emit light towards four sides of the hollow light block grid 3, respectively, such that the pixel unit can obtain sufficient uniformity of light distribution within a shorter propagating distance.

Further preferably, the plurality of LED chips included in the light-emitting unit 2 is multi-color LED chips, and the LED chips of the same color are symmetrically distributed with respect to the center of the pixel unit. This technical solution can further improve the color uniformity. For example, in FIG. 10b, the LED chips 2-1 and 2-2 may both be green LEDs, allowing light distribution of green light to be more uniform in the pixel unit.

It can be understood that the LED chip emitting light towards one side of the hollow light block grid may include a plurality of sub-chips. For example, the LED chip 2-4 may include a blue LED sub-chip and a red LED sub-chip, so that the LED chip 2-4 simultaneously emits red and blue light.

Although the LED light-emitting unit 2 including a plurality of LED chips is disposed at the center of the pixel unit in the embodiment of FIG. 10a and FIG. 10b, it can be understood that in other embodiments of the present disclosure, the plurality of LED chips included in the LED light-emitting unit may be separated in a manner that different LED chips are located at edge portions of the pixel unit or under the hollow light block grid, and in the meantime, the different LED chips emit light towards different sides of the hollow light block grid. The position of a single LED chip can refer to the designs shown in FIG. 8a and FIG. 8c, which will not be repeated herein.

To sum up, through the combination of the LED array and the optical diffusion film, the LED display screen of the present disclosure can be effectively applied in a broader application range, and the pixel filling rate of the LED light-emitting unit can be improved, thereby reducing the non-softness problems caused by the granular sensation. Thus, the display effect of the LED display can be improved, thereby improving visual enjoyment and experience of the audience.

In addition, crosstalk between adjacent pixels can be prevented by providing the matrix light block frame in the LED display screen of the present disclosure.

Furthermore, the LED light-emitting units of the LED display screen of the present disclosure emit light towards the side of the light block frame, and thus the black filling rate of the pixels can be still improved even if the size of the LED light-emitting units is not reduced, thereby improving the contrast of the display screen.

The LED display screen of the present disclosure has excellent contrast effect, particularly suitable for consumer-side theater and living room application scenarios, and it can also satisfy other high-end commercial scenarios.

The embodiments in the specification are described in a progressive manner. Each embodiment focuses on the differences from other embodiments. The same and similar parts between the embodiments can be referred to each other.

Those skilled in the art should understand that, according to design requirements and other factors, various modifications, combinations, sub-combinations, and changes may be made within the scope of the pending claims of the present application or equivalents thereof.

What is claimed is:

1. An LED display screen, comprising:
   an LED array comprising a plurality of LED light-emitting units and configured to emit light;
   an optical diffusion film provided on a light-emitting side of the LED array;
   a matrix light block frame comprising a plurality of hollow light block grids, the plurality of hollow light block grids being arranged in one-to-one correspondence with the plurality of LED light-emitting units; and
   a substrate configured to support the LED array and the matrix light block frame,
   wherein the light emitted by each of the plurality of LED light-emitting units is transmitted through one of the plurality of hollow light block grids corresponding to a LED light-emitting unit of the plurality of LED light-emitting units and then is diffused to a viewer side through the optical diffusion film, and the plurality of LED light-emitting units emits light towards the plurality of hollow light block grids.

2. The LED display screen according to claim 1, wherein a surface of each of the plurality of LED light-emitting units facing towards the viewer side is covered by a light-absorbing material.

3. The LED display screen according to claim 2, wherein the light-absorbing material further covers at least a portion of a surface of the substrate where none of the plurality of LED light-emitting units is provided.

4. The LED display screen according to claim 1, wherein each of the plurality of LED light-emitting units further comprises a light guiding device that is configured to guide the light emitted by the corresponding LED light-emitting unit towards one of the plurality of hollow light block grids.

5. The LED display screen according to claim 1, wherein a reflective layer is provided on a side wall of each of the plurality of hollow light block grids.

6. The LED display screen according to claim 5, wherein the reflective layer is a diffusion layer.

7. The LED display screen according to claim 5, wherein the reflective layer is a specular reflective layer.

8. The LED display screen according to claim 5, wherein each of the plurality of LED light-emitting units is disposed at a position deviating from a center of one of the plurality of hollow light block grids corresponding to the corresponding LED light-emitting unit.

9. The LED display screen according to claim 5, wherein each of the plurality of LED light-emitting units comprises a plurality of LED chips, wherein the plurality of LED chips emits light towards different sides of one of the plurality of hollow light block grids corresponding to the corresponding LED light-emitting unit.

10. The LED display screen according to claim 5, wherein each of the plurality of LED light-emitting units is disposed below one of the plurality of hollow light block grids corresponding to the corresponding LED light-emitting unit.

11. The LED display screen according to claim 1, wherein the optical diffusion film is a bulk diffusion film, and the bulk diffusion film is provided with diffusion particles, wherein the diffusion particles are inorganic particles or organic particles.

12. The LED display screen according to claim 1, wherein the optical diffusion film is a surface diffusion film.

13. The LED display screen according to claim 1, wherein the optical diffusion film has a diffusion angle greater than 10 degrees.

14. The LED display screen according to claim 13, wherein the diffusion angle is greater than 40 degrees.

15. The LED display screen according to claim 1, wherein the optical diffusion film is an isotropic diffusion film or an anisotropic diffusion film.

16. The LED display screen according to claim 1, further comprising:
   a polarizer disposed on an optical path of the light emitted by the LED array,
   wherein the polarizer comprises first polarizing regions and second polarizing regions that are alternately arranged in an array, the light emitted by the LED array is transmitted through the first polarizing regions to generate first polarized light and is transmitted through the second polarizing regions to generate second polarized light.

* * * * *